United States Patent
Abas et al.

(10) Patent No.: US 10,020,213 B1
(45) Date of Patent: Jul. 10, 2018

(54) SEMICONDUCTOR WAFER CARRIERS

(71) Applicant: SunPower Corporation, San Jose, CA (US)

(72) Inventors: Emmanuel Chua Abas, Santa Rosa (PH); Carl Anthony Pangan Pondoyo, Makati (PH); Emil Alcaraz Pares, Santo Tomas (PH); Arnold Villamor Castillo, Batangas (PH); Vergil Rodriguez Sandoval, Calamba (PH)

(73) Assignee: SUNPOWER CORPORATION, San Jose, CA (US)

( * ) Notice: Subject to any disclaimer, the term of this patent is extended or adjusted under 35 U.S.C. 154(b) by 0 days.

(21) Appl. No.: 15/395,824

(22) Filed: Dec. 30, 2016

(51) Int. Cl.
*A47G 19/08* (2006.01)
*H01L 21/673* (2006.01)

(52) U.S. Cl.
CPC .. *H01L 21/67316* (2013.01); *H01L 21/67313* (2013.01); *H01L 21/67326* (2013.01)

(58) Field of Classification Search
CPC .............. H01L 21/67316; H01L 21/67; H01L 21/67005; H01L 21/67313; H01L 21/67326; H01L 21/6733; H01L 21/673; H01L 21/67303; H01L 21/6732; H01L 21/6735; B65G 49/07; A47B 65/10; A47B 57/58; A47B 65/15; A47B 65/20; A47B 57/583; A47B 57/588; A47B 57/585; A47F 1/126; A47F 1/00; A47F 1/04; A47F 1/12; A47F 1/125; B42F 17/02; B42F 17/12; B42F 17/14
(Continued)

(56) References Cited

U.S. PATENT DOCUMENTS 2,620,929 A * 12/1952 Sportsman ............. A47B 65/00
108/28
3,949,891 A    4/1976 Butler et al.
(Continued)

FOREIGN PATENT DOCUMENTS

KR    10-2005-0049264 A    5/2005
KR    10-0830998 B1    5/2008
(Continued)

OTHER PUBLICATIONS

Notification of Transmittal of the International Search Report and the Written Opinion of the International Searching Authority, or the Declaration for International Application No. PCT/US2017/067018 (dated Apr. 16, 2018).

*Primary Examiner* — Jennifer E. Novosad
(74) *Attorney, Agent, or Firm* — Jenkins, Wilson, Taylor & Hunt, P.A.

(57) ABSTRACT

Semiconductor wafer carriers, methods for manufacturing the semiconductor wafer carriers, and methods for using the semiconductor wafer carriers. The semiconductor wafer carriers can include features for avoiding double-slotting, for preventing glove marks on semiconductor wafers, and for providing additional sitting and storage options for the wafer carrier. In some examples, a semiconductor wafer carrier includes multiple notched left-side rods that are parallel in a vertical direction and multiple notched right-side rods that are parallel in the vertical direction. The semiconductor wafer carrier includes one or more bottom rods. The left-side rods, the right-side rods, and the one or more bottom rods are joined to define semiconductor wafer slots.

18 Claims, 16 Drawing Sheets

(58) Field of Classification Search
USPC .............. 211/41.18, 59.3, 43, 21, 50, 49.1;
206/710, 711, 454, 832, 833; 414/935,
414/936, 937, 940, 941
See application file for complete search history.

(56) References Cited

U.S. PATENT DOCUMENTS

| | | | | |
|---|---|---|---|---|
| 4,355,974 | A * | 10/1982 | Lee | C30B 31/103 |
| | | | | 118/500 |
| 4,388,140 | A * | 6/1983 | Nakazato | H01L 21/67075 |
| | | | | 156/345.23 |
| 4,471,716 | A | 9/1984 | Milliren | |
| 4,515,104 | A * | 5/1985 | Lee | B05C 13/02 |
| | | | | 118/500 |
| 4,566,839 | A | 1/1986 | Butler | |
| 4,572,101 | A * | 2/1986 | Lee | B05C 13/02 |
| | | | | 118/500 |
| 4,872,554 | A * | 10/1989 | Quernemoen | C30B 31/10 |
| | | | | 118/500 |
| 4,981,222 | A * | 1/1991 | Lee | C23C 16/4587 |
| | | | | 118/500 |
| 4,993,559 | A * | 2/1991 | Cota | H01L 21/67313 |
| | | | | 211/41.18 |
| 5,117,984 | A * | 6/1992 | Kennedy | A47B 81/068 |
| | | | | 211/40 |
| 5,657,879 | A * | 8/1997 | Anderson | H01L 21/67313 |
| | | | | 211/41.18 |
| 5,752,609 | A * | 5/1998 | Kato | H01L 21/67309 |
| | | | | 118/500 |
| 5,762,208 | A * | 6/1998 | Yeh | A47B 81/068 |
| | | | | 211/184 |
| D409,158 | S * | 5/1999 | Shimazu | 206/832 |
| 5,908,042 | A * | 6/1999 | Fukunaga | B08B 11/02 |
| | | | | 134/25.1 |
| 6,062,853 | A * | 5/2000 | Shimazu | H01L 21/67309 |
| | | | | 211/41.18 |
| 6,089,377 | A * | 7/2000 | Shimizu | H01L 21/67313 |
| | | | | 118/500 |
| 6,186,344 | B1 * | 2/2001 | Park | H01L 21/6734 |
| | | | | 211/41.1 |
| 6,308,839 | B1 * | 10/2001 | Steinberg | G11B 23/0236 |
| | | | | 211/184 |
| 6,576,065 | B1 * | 6/2003 | Lamure | H01L 21/67057 |
| | | | | 118/423 |
| 6,648,150 | B2 * | 11/2003 | Hartstone | G11B 33/0461 |
| | | | | 211/11 |
| 6,814,808 | B1 * | 11/2004 | Gados | H01L 21/67313 |
| | | | | 118/500 |
| 7,001,130 | B2 * | 2/2006 | Ransom | B25J 9/0096 |
| | | | | 206/448 |
| 7,661,544 | B2 * | 2/2010 | Herzog | H01L 21/67309 |
| | | | | 211/41.18 |
| 7,736,461 | B2 * | 6/2010 | Kim | C03C 15/00 |
| | | | | 156/345.23 |
| 8,033,401 | B2 * | 10/2011 | Lee | H01L 21/67313 |
| | | | | 211/41.18 |
| 8,221,600 | B2 | 7/2012 | Ganti | |
| 8,221,601 | B2 | 7/2012 | Chen et al. | |
| 8,317,987 | B2 | 11/2012 | Abas et al. | |
| 8,322,300 | B2 | 12/2012 | Pavani et al. | |
| 8,449,238 | B2 | 5/2013 | Mulligan et al. | |
| 8,557,093 | B2 | 10/2013 | Cousins et al. | |
| 9,556,512 | B2 | 1/2017 | Cousins et al. | |
| 2004/0200788 | A1 * | 10/2004 | Shon | H01L 21/6734 |
| | | | | 211/41.18 |
| 2005/0224430 | A1 * | 10/2005 | Salemi | A47B 57/585 |
| | | | | 211/43 |
| 2011/0062053 | A1 * | 3/2011 | Vo | H01L 21/67313 |
| | | | | 206/722 |
| 2012/0021552 | A1 * | 1/2012 | Alexander | H01L 21/67109 |
| | | | | 438/57 |
| 2016/0322253 | A1 * | 11/2016 | Yen | H01L 21/67313 |

FOREIGN PATENT DOCUMENTS

| | | |
|---|---|---|
| KR | 10-2013-0121377 A | 11/2013 |
| KR | 10-1509173 B1 | 4/2015 |
| KR | 10-2016-0101130 A | 8/2016 |

\* cited by examiner

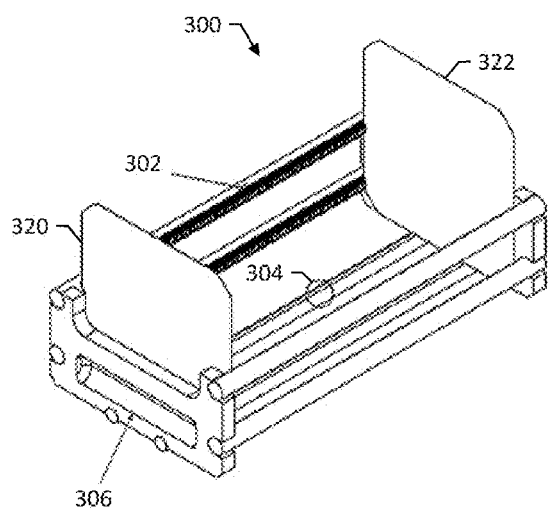
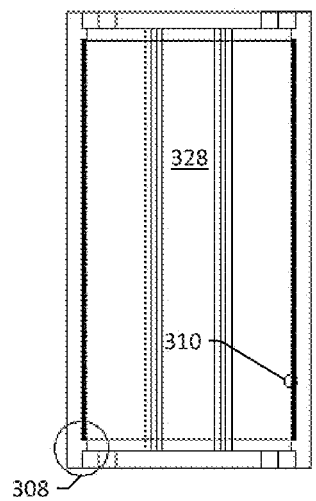
FIG. 3A                FIG. 3B
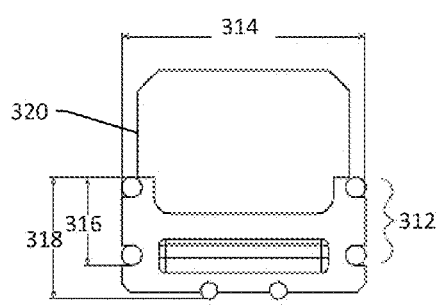
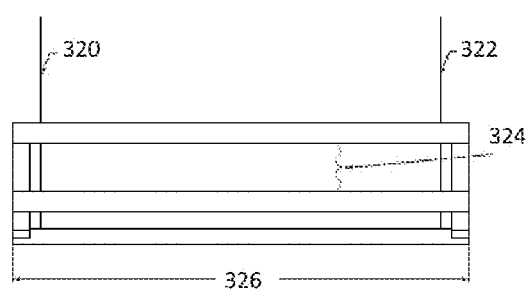
FIG. 3C                FIG. 3D

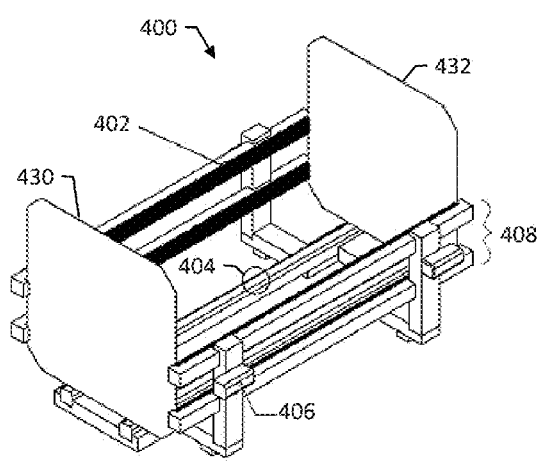
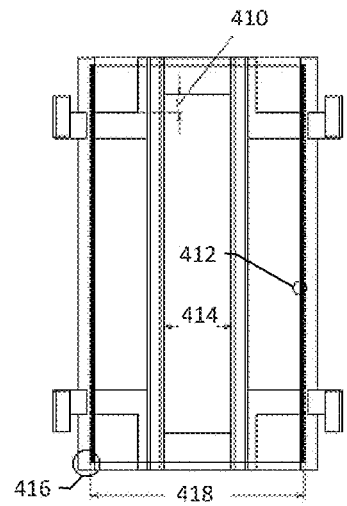
FIG. 4A              FIG. 4B
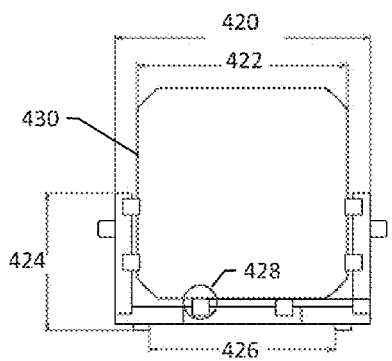
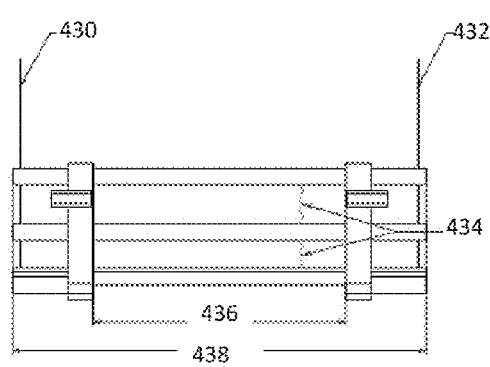
FIG. 4C              FIG. 4D

US 10,020,213 B1

SEMICONDUCTOR WAFER CARRIERS

TECHNICAL FIELD

The subject matter described in this specification relates generally to manufacturing solar cells and other semiconductor structures using semiconductor wafer carriers.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit. Manufacturing solar cells and other semiconductor structures typically involves loading semiconductor wafers into a wafer carrier for one or more of various semiconductor processing stages.

BRIEF DESCRIPTION OF THE DRAWINGS

FIGS. 3A-E illustrate an example wafer carrier having a number of notched side rods that are parallel in a vertical direction;

FIGS. 4A-E illustrate an example wafer carrier having a number of notched side rods that are parallel in a vertical direction;

DETAILED DESCRIPTION

Figure 1A:
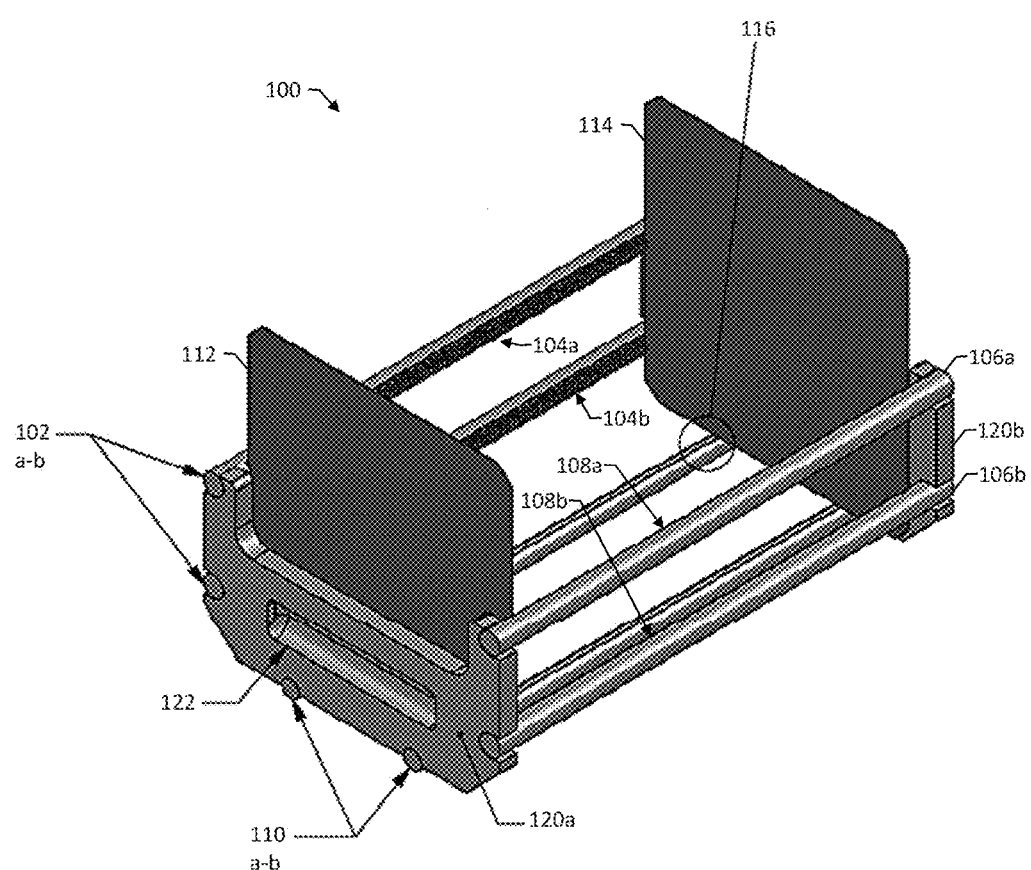
FIGS. 1A-C illustrate an example semiconductor wafer carrier.

This specification describes semiconductor wafer carriers, methods for manufacturing the semiconductor wafer carriers, and methods for using the semiconductor wafer carriers. The semiconductor wafer carriers can include features for avoiding double-slotting, for preventing glove marks on semiconductor wafers, and for providing additional sitting and storage options for the wafer carrier.

In some examples, the semiconductor wafer carrier includes upper and lower left-side rods that are parallel in a vertical direction, wherein the upper and lower left-side rods each include a plurality of left-side notches, and wherein the left-side notches of the upper left-side rod are vertically aligned with the left-side notches of the lower left-side rod. The semiconductor wafer carrier includes upper and lower right-side rods that are parallel in the vertical direction, wherein the upper and lower right-side rods each include a plurality of right-side notches, and wherein the right-side notches of the upper right-side rod are vertically aligned with the right-side notches of the lower right-side rod. The semiconductor wafer carrier includes one or more bottom rods, wherein the upper and lower left-side rods, the upper and lower right-side rods, and the one or more bottom rods are joined so that the left-side notches face the right-side notches, defining semiconductor wafer slots between the left-side notches, the right-side notches, and the bottom rods.

The semiconductor wafer carrier can include one or more of the following optional features. Each of the each of the one or more bottom rods can include a smooth surface facing vertically towards the plurality of semiconductor wafer slots. The semiconductor wafer carrier can include front and back plates each extending laterally between the upper and lower left-side rods and the upper and lower right-side rods, and the upper and lower left-side rods and the upper and lower right-side rods and the one or more bottom rods extend horizontally from the front plate to the back plate. At least one of the front and back plates can include an indentation extending laterally across an outside face of the at least one of the front and back plates, and the indentation is shaped for gripping by an operator's fingers during handling. The semiconductor wafer carrier can include front and back handler locks each protruding away from the semiconductor wafer carrier and being shaped to lock and support a matching handler. The upper and lower left-side rods, the upper and lower right-side rods, and the one or more bottom rods are formed of quartz or silicon carbide. Each of the left-side notches and right-side notches can include two opposing chamfer edges defining a width sized to receive a standard-conforming polycrystalline solar wafer. Each of the plurality of semiconductor wafer slots can have a height between the upper left-side and upper right-side rods and the one or more bottom rods sized to receive a standard-conforming polycrystalline solar wafer, and each of the plurality of semiconductor wafer slots can have a lateral length between the upper and lower left-side rods and the upper and lower right-side rods sized to receive the standard-conforming polycrystalline solar wafer.

In some examples, a method for processing semiconductor wafers includes loading each semiconductor wafer of a plurality of semiconductor wafers into a respective semiconductor wafer slot of a semiconductor wafer carrier. The method includes moving the semiconductor wafer carrier into a processing station and processing the semiconductor wafers at the processing station while the semiconductor wafers are loaded into the semiconductor wafer carrier.

The method can include one or more of the following optional features. Loading each semiconductor wafer into a respective semiconductor wafer slot can include loading each semiconductor wafer through a bottom side of the semiconductor wafer carrier. Each of the one or more bottom rods can include a smooth surface facing vertically towards the plurality of semiconductor wafer slots, and each of the left-side notches and right-side notches can include two opposing chamfer edges, and loading each semiconductor wafer into a respective semiconductor wafer slot can include loading each semiconductor wafer to fit between the respective two opposing chamfer edges of the left-side notches and right-sides notches and to contact the smooth surface of the one or more bottom rods. The semiconductor wafer carrier can include front and back plates each extending laterally between the upper and lower left-side rods and the upper and lower right-side rods, and each of the front and back plates can include an indentation extending laterally across an outside face of the plate, and moving the semiconductor wafer carrier comprises lifting the semiconductor wafer carrier using the indentations of the front and back plates. The semiconductor wafer carrier can include front and back handler locks each protruding away from the semiconductor wafer carrier, and wherein moving the semiconductor wafer carrier comprises locking a handler onto the front and back handler locks and lifting the semiconductor wafer carrier by lifting the handler so that the front and back handler locks support the semiconductor wafer carrier. The upper and lower left-side rods, the upper and lower right-side rods, and the one or more bottom rods can be formed of quartz or silicon carbide, and processing the semiconductor wafers can include processing the semiconductor wafers using conditions that are corrosive to the semiconductor wafers and non-corrosive to the quartz or silicon carbide.

In some examples, a method for manufacturing a semiconductor wafer carrier includes securing a plurality of holding parts around upper and lower left-side rods, upper and lower right-side rods, and one or more bottom rods. The method includes joining the upper and lower left-side rods, the upper and lower right-side rods, and the one or more bottom rods so that the left-side notches face the right-side notches, defining a plurality of semiconductor wafer slots between the left-side notches, the right-side notches, and the bottom rods.

The method can include one or more of the following optional features. Securing the holding parts can include securing a plurality of inner plates between the between the upper and lower left-side rods and the upper and lower right-side rods, each inner plate extending laterally between the upper and lower left-side rods and the upper and lower right-side rods. Securing the holding parts can include securing a plurality of outer parts around an exterior of the semiconductor wafer carrier to apply a compressive force on the upper and lower left-side rods and the upper and lower right-side rods towards the inner plates. Securing the holding parts can include placing an inner rod through a respective hole of each of the inner plates, the inner rod extending horizontally from a front side to a back side of the semiconductor wafer carrier, and securing the holding parts can include coupling front and back ends of the inner rod to front and back pivots of front and back floor stands. Joining the upper and lower left-side rods, the upper and lower right-side rods, and the one or more bottom rods can include rotating the semiconductor wafer carrier about the front and back pivots of the front and back floor stands. The upper and lower left-side rods, the upper and lower right-side rods, and the one or more bottom rods can be formed of quartz, and joining the joining the upper and lower left-side rods, the upper and lower right-side rods, and the one or more bottom rods can include quartz welding.

Figure 1B:
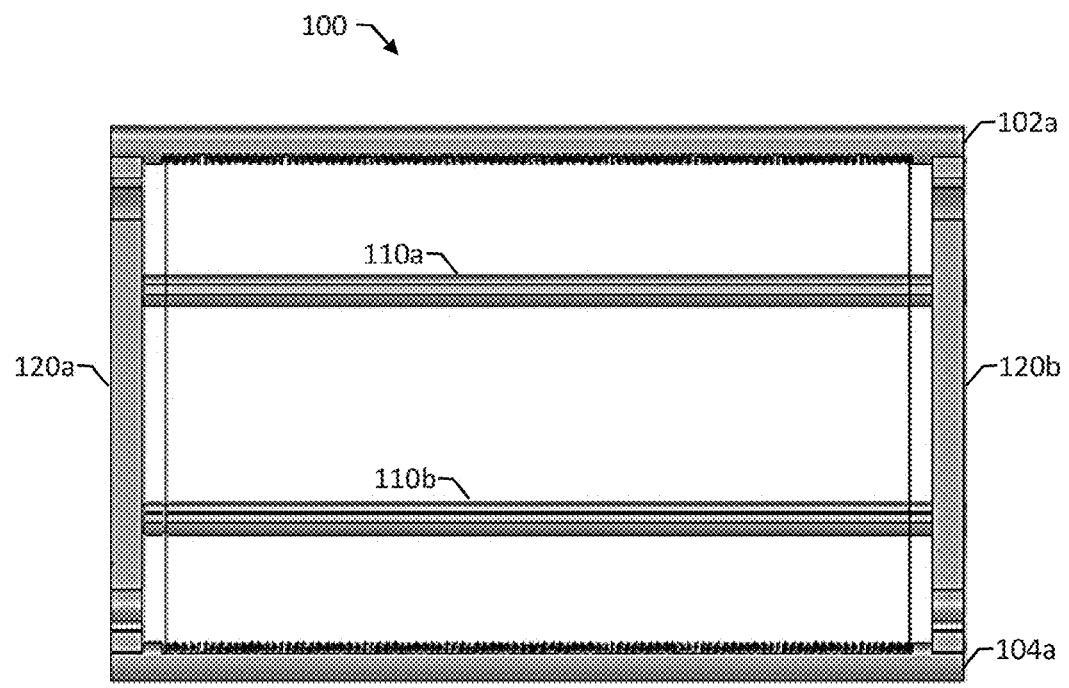
Figure 1C:
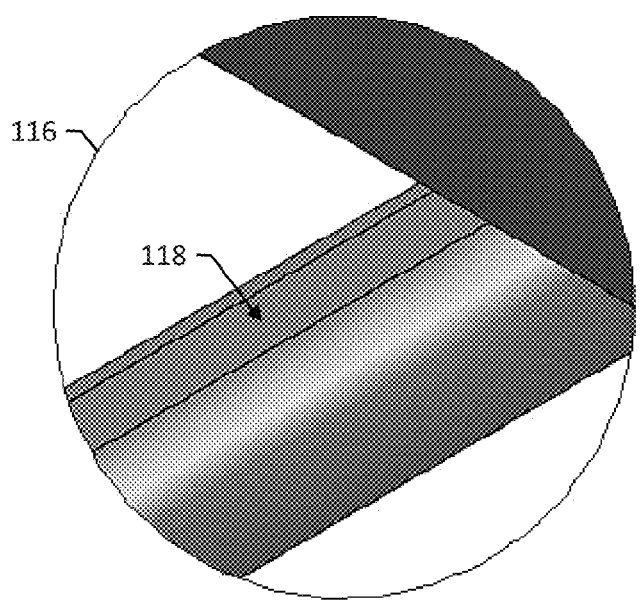

FIGS. 1A-C illustrate an example semiconductor wafer carrier 100. FIG. 1A shows an isometric view of the wafer carrier. FIG. 1B shows a top view of the wafer carrier 100. FIG. 1C shows a detail view 116 of a portion of the wafer carrier 100.

The wafer carrier 100 includes upper and lower left-side rods 102a-b that are parallel in a vertical direction. The upper and lower left-side rods 102a-b each have a number of left-side notches 104a-b. The left-side notches 104a of the upper left-side rod 102a are vertically aligned with the left-side notches 104b of the lower left-side rod 102b. The wafer carrier 100 also includes upper and lower right-side rods 106a-b that are parallel in the vertical direction.

The upper and lower right-side rods 106a-b mirror the upper and lower left-side rods 106a-b across the wafer carrier 100. The upper and lower right-side rods 106a-b each have a number of right-side notches 108a-b. The right-side notches 108a of the upper right-side rod 106a are vertically aligned with the right-side notches 108b of the lower right-side rod 106b. For example, each of the left-side notches 104a-b and right-side notches 108a-b can have two opposing chamfer edges defining a width sized to receive a standard-conforming polycrystalline solar wafer.

The wafer carrier 100 includes left and right bottom rods 110a-b. Although two bottom rods are illustrated, the wafer carrier 100 can be implemented using only one bottom rod or more than two bottom rods. The upper and lower left-side rods 102a-b, the upper and lower right-side rods 106a-b, and the bottom rods 110a-b are joined so that the left-side notches 104a-b face the right-side notches 108a-b, defining a number of semiconductor wafer slots between the left-side notches 104a-b, the right-side notches 108a-b, and the bottom rods 110a-b.

For example, each of the semiconductor wafer slots can have a height between the upper left-side and upper right-side rods 102a and 106a and the bottom rods 110a-b sized to receive a standard-conforming polycrystalline solar wafer, for example, a 5 inch or 6 inch wafer (e.g., a wafer having a diagonal width across the face of the wafer of 5 inches or 6 inches). Each of the semiconductor wafer slots can have a lateral length between the upper and lower left-side rods 102a-b and the upper and lower right-side rods 106a-b sized to receive the standard-conforming polycrystalline solar wafer. FIGS. 1A-C show two example semiconductor wafers 112 and 114 loaded into the wafer carrier 100.

The upper and lower left-side rods 102a-b, the upper and lower right-side rods 106a-b, and the bottom rods 110a-b may be formed of any appropriate material. Typically, the material is nonreactive two one or more semiconductor manufacturing processes, e.g., chemical processes. For example, the upper and lower left-side rods 102a-b, the upper and lower right-side rods 106a-b, and the bottom rods 110a-b may be formed of quartz or silicon carbide.

In some examples, each of the bottom rods 110a-b has a smooth surface facing vertically towards the plurality of semiconductor wafer slots. FIG. 1C shows a detail view 116 of a portion of the wafer carrier 100 illustrating such a smooth surface 118 on the left bottom rod 110a. The smooth surface 118 is "smooth" in that it lacks notches matching the left-side notches 104a-b and the right-side notches 108a-b. For example, the smooth surface 118 may be uniformly smooth except for ordinary manufacturing defects.

The smooth surface 118 may be useful, for example, to eliminate a requirement for aligning semiconductor wafers between side notches and bottom notches. The smooth surface 118 can reduce the chance of double-slotting since the wafers need only be aligned in the side notches. Since the wafer carrier 100 includes upper and lower left-side rods 102a-b and upper and lower right-side rods 106a-b, bottom notches may not be needed to secure semiconductor wafers within the wafer carrier. Moreover, the smooth surface 118 may permit some normal movement of the semiconductor wafers during a chemical process carried out while the semiconductor wafers are loaded into the wafer carrier 100.

Referring back to FIGS. 1A-B, in some examples, the wafer carrier 100 includes front and back plates 120a-b. Each of the front and back plates 120a-b extends laterally between the upper and lower left-side rods 102*a-b* and the upper and lower right-side rods 106*a-b*. The upper and lower left-side rods 102*a-b* and the upper and lower right-side rods 106*a-b* and the bottom rods 110*a-b* are joined by the front and back plates 120*a-b* to extend horizontally from the front plate 120*a* to the back plate 120*b*. Since the front and back plates 120*a-b* may be substantially planar, the wafer carrier 100 can rest one of the front and back plates 120*a-b* when laid on a planar surface, which can be useful, e.g., when storing the wafer carrier 100 when it is not in use.

In some examples, the front and back plates 120*a-b* (or at least one of the front and back plates 120*a-b*) each include an indentation 122 extending laterally across an outside face of the plate. The indentation 122 is shaped for gripping by an operator's fingers during handling. For example, the indentation 122 may be shaped as a smooth concave indentation, curving inwards from the outside face of the plate and then curving outwards back to the outside face of the plate. By including the indentation 122, an operator can grip the wafer carrier 100 and avoid touching the semiconductor wafers that are loaded, which can be useful, e.g., to avoid glove marks on the wafers.

Figure 2A:
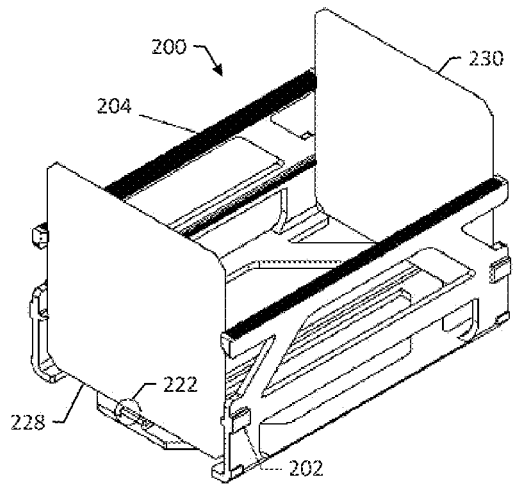
FIGS. 2A-H illustrate an example wafer carrier having a number of notched side rods that are parallel in a vertical direction.
Figure 2B:
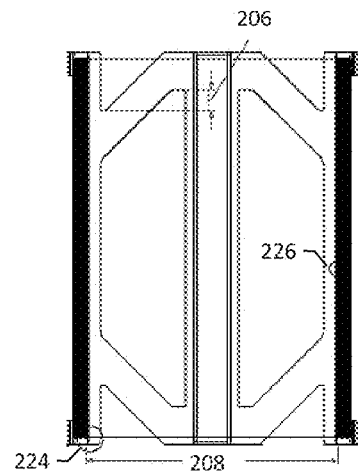
Figure 2C:
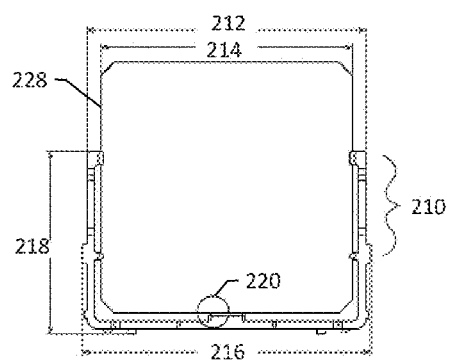
Figure 2D:
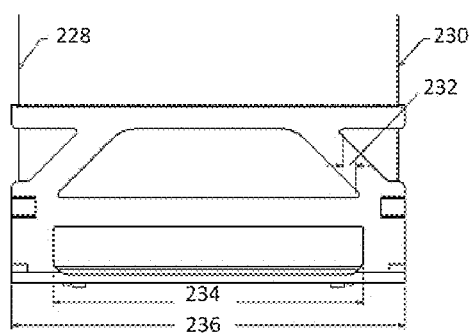
Figure 2E:
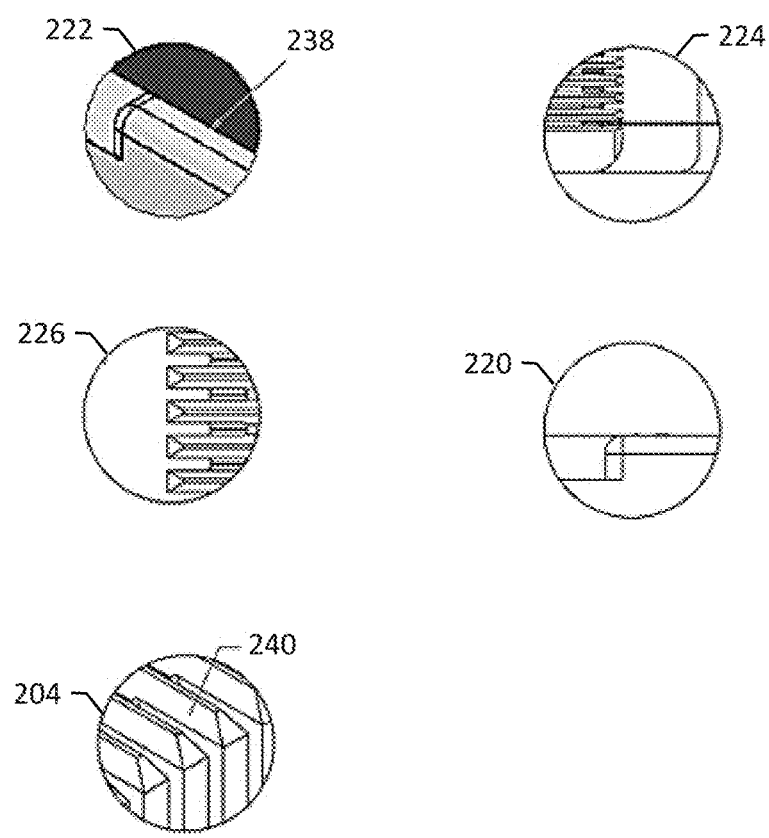

FIGS. 2A-H illustrate an example wafer carrier 200 having a number of notched side rods 210 that are parallel in a vertical direction. FIG. 2A is an isometric view of the wafer carrier 200, FIG. 2B is a top view of the wafer carrier 200, FIG. 2C is a front view of the wafer carrier 200, and FIG. 2D is a right side view of the wafer carrier 200. FIG. 2E shows detail views of portions of the wafer carrier 200.

Referring to FIGS. 2A-D, the wafer carrier 200 includes at least one handler lock 202 and typically handler locks on the front and sides of the wafer carrier 200. The handler lock 202 is shaped to engage a handler that an operator or robot can use to lift the wafer carrier 200. The wafer carrier 200 includes an overlapping opening 206, which can be useful, e.g., to guide semiconductor wafers into wafer slots during loading of the semiconductor wafers into the wafer carrier 200.

For example, an automated wafer-loading robot can load semiconductor wafers into the wafer carrier 200. The wafer carrier 200 also includes a side overlapping opening 232 (e.g., on each of the left and right sides) for guiding semiconductor wafers. FIGS. 2A-D illustrate two example semiconductor wafers 228 and 230.

In some examples, the wafer carrier 200 is sized to accommodate standard-conforming semiconductor wafers, e.g., standard sized silicon solar wafers. For example, the wafer carrier 400 can have a lateral width 216 between handler locks of approximately 175-185 mm, an interior lateral width 208 of approximately 152-162 mm, an exterior lateral width 212 of approximately 168-178 mm, a vertical height 218 of approximately 109-119 mm, an exterior horizontal depth 236 of approximately 240-250 mm, and an interior horizontal depth 234 of approximately 189-199 mm. In that case, the wafer carrier 200 can accommodate approximately 140-160 wafers having a lateral width 214 of approximately 151-161 mm.

Referring to FIG. 2E, a first detail view 222 shows a portion of a bottom rod with a smooth surface 238 facing vertically upwards. A second detail view 224 shows a portion of an edge of the wafer carrier 200 illustrating that the wafer carrier 200 can be uniformly flat on its front and back sides to allow the wafer carrier 200 to sit in that orientation on a surface, which can be useful, e.g., to save space in storing the wafer carrier 200.

A third detail view 226 shows a portion of a notched side rod illustrating the notches, which can have a pitch of approximately 1.5-1.6 mm (e.g., a pitch from notch to notch, or a pitch from one side of a notch to the other side). A fourth detail view 220 shows a portion of a bottom rod illustrating a smooth surface plus a fillet, which can be useful, e.g., to prevent or reduce wafer edge chipping. A fifth detail view 204 shows a portion of a notched side rod illustrating a chamfer 240 for the notches, which can be useful, e.g., for guiding semiconductor wafers into wafer slots.

Figure 2F:
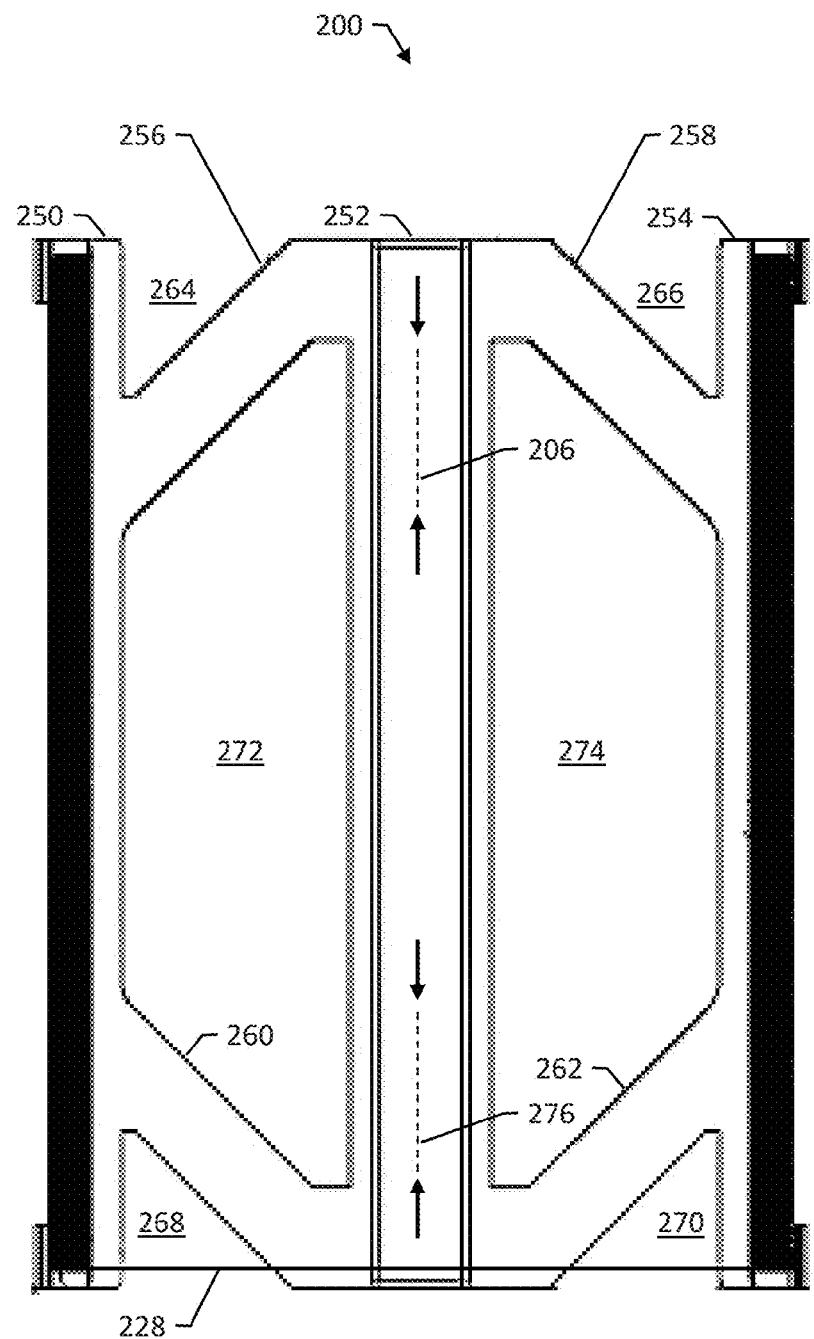

FIG. 2F shows another top view of the wafer carrier 200. As shown in FIG. 2F, the wafer carrier 200 includes three bottom rods—a left bottom rod 250, a center bottom rod 252, and a right bottom rod 254. The bottom rods 250, 252, and 254 are joined by cross-members 256, 258, 260, and 262. The left bottom rod 250 is joined to the center bottom rod 252 by front-left and back-left cross-members 260 and 256, and right bottom rod 254 is joined to center bottom rod 252 by front-right and back-right cross-members 262 and 258.

The cross-members 256, 258, 260, and 262 are horizontally angled with respect to the bottom rods 250, 252, and 254. Due to the horizontal angling, the cross-members 256, 258, 260, and 262 define outer apertures 264, 266, 268, and 270 between the bottom rods 250, 252, and 254 and inner apertures 272 and 274 between the bottom rods 250, 252, and 254. The inner-left aperture 272 overlaps, from left to right, the outer-back-left aperture 264 in a back overlap region 206 and the outer-front-left aperture 268 in a front overlap region 276. Similarly, the inner-right aperture 274 overlaps, from left to right, the outer-back-right aperture 266 in the back overlap region 206 and the outer-front-right aperture 270 in the front overlap region 276.

The overlapping apertures are useful, for example, for providing structural rigidity to the wafer carrier 200 while also allowing an automated tool to access loaded semiconductor wafers through the apertures from the bottom. If the apertures did not overlap, for instance, then one or more regions would exist where the automated tool would not be able to access any semiconductor wafers loaded in those regions. Since the automated tool would not be able to access those semiconductor wafers, semiconductor wafers would not be able to be loaded into those slots, e.g., reducing the capacity of the wafer carrier compared to a wafer carrier with all of its semiconductor wafer slots loaded.

Figure 2G:
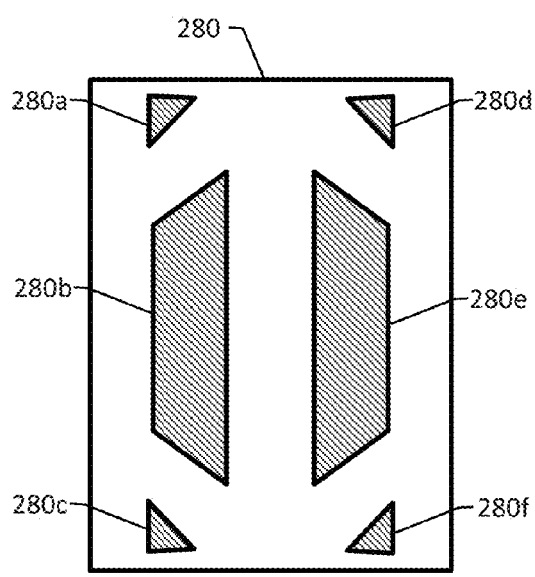

FIG. 2G is a top view of an example pusher 280 of an automated tool configured for pushing semiconductor wafers out of the wafer carrier 200 through the bottom of the wafer carrier 200. The pusher 280 includes raised sections 280*a-f* that are shaped to mirror the overlapping apertures of the wafer carrier 200. The raised sections 280*a-f* may be flat or have any appropriate surface topology or attached devices for contacting the semiconductor wafers. In some examples, the raised sections 280*a-f* have attached combs that are sized to wrap the semiconductor wafers when the semiconductor wafers are loaded into the wafer carrier 200.

Figure 2H:
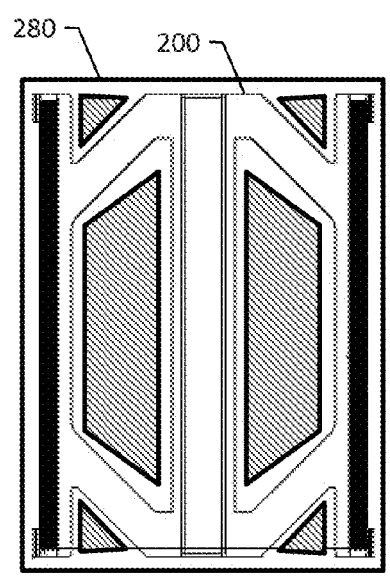

FIG. 2H is a top view of the pusher 280 when pushed through the bottom of the wafer carrier 200. For example, a robotic arm or assembly may be programmed to push the pusher 280 through the bottom of the wafer carrier 200 after the wafer carrier, and the loaded semiconductor wafers, have been through a semiconductor manufacturing process step. The pusher 280 may push one or more of the semiconductor wafers into another wafer carrier or another device for processing the semiconductor wafers to continue a semiconductor manufacturing process.

Similarly, the pusher 280 and the automated tool may be used in loading the semiconductor wafers into the wafer carrier 200. In that case, the pusher 280 is pushed up between the bottom rods 250, 252, and 254 prior to loading the semiconductor wafers, so that the semiconductor wafers contact the pusher 280 when they are initially loaded into the wafer carrier 200. The pusher 280 can then be retracted from between the bottom rods 250, 252, and 254 to allow the semiconductor wafers to fall under their own gravity onto the bottom rods.

Figure 3E:
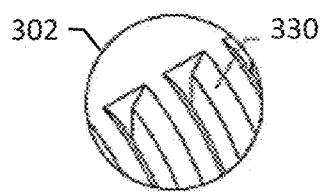
Figure 3E:
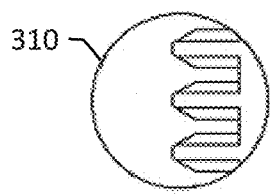
Figure 3E:
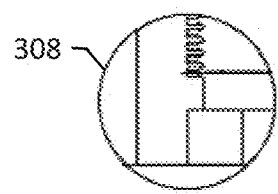
Figure 3E:
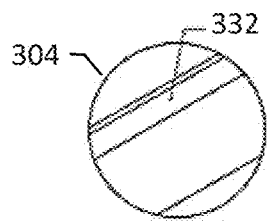

FIGS. 3A-E illustrate an example wafer carrier 300 having a number of notched side rods 312 that are parallel in a vertical direction. FIG. 3A is an isometric view of the wafer carrier 300, FIG. 3B is a top view of the wafer carrier 300, FIG. 3C is a front view of the wafer carrier 300, and FIG. 3D is a right side view of the wafer carrier 300. FIG. 3E shows detail views of portions of the wafer carrier 300.

Referring to FIGS. 3A-D, the wafer carrier 300 includes at least one manual handle 306 along with slab-type support, which can be useful, e.g., to prevent glove marks on semiconductor wafers loaded into the wafer carrier 300. The wafer carrier 300 includes at least one side opening 324 (typically, one on each of the left and right sides) and a bottom opening 328. The side and bottom openings 324 and 328 can be useful, e.g., during loading of semiconductor wafers by an automated wafer-loading robot. FIGS. 3A-D illustrate two example semiconductor wafers 320 and 322.

In some examples, the wafer carrier 300 is sized to accommodate standard-conforming semiconductor wafers, e.g., standard sized silicon solar wafers. For example, the wafer carrier can have a lateral width 314 of approximately 138-148 mm, a vertical height 316 between parallel side rods of approximately 47-57 mm, a vertical height from upper rods to bottom rods of approximately 66-76 mm, and a horizontal depth 326 of approximately 264-274 mm.

Referring to FIG. 3E, a first detail view 302 shows a portion of a notched side rod having a chamfer 330 upon entry to guide semiconductor wafers into the notches. A second detail view 310 shows a portion of a notched side rod illustrating an example pitch for the side notches; the pitch can be, e.g., approximately 2-3 mm so that the wafer carrier 300 can accommodate approximately 100 wafers (e.g., a pitch from notch to notch, or a pitch from one side of a notch to the other side).

A third detail view 308 shows an edge of the wafer carrier 300 illustrating that the wafer carrier 300 can be uniformly flat on its front and back sides to allow the wafer carrier 300 to sit in that orientation on a surface, which can be useful, e.g., to save space in storing the wafer carrier 300. A fourth detail view 304 shows a portion of a bottom rod having a smooth surface 332, which can be useful, e.g., to prevent or reduce wafer edge chipping.

Figure 4E:
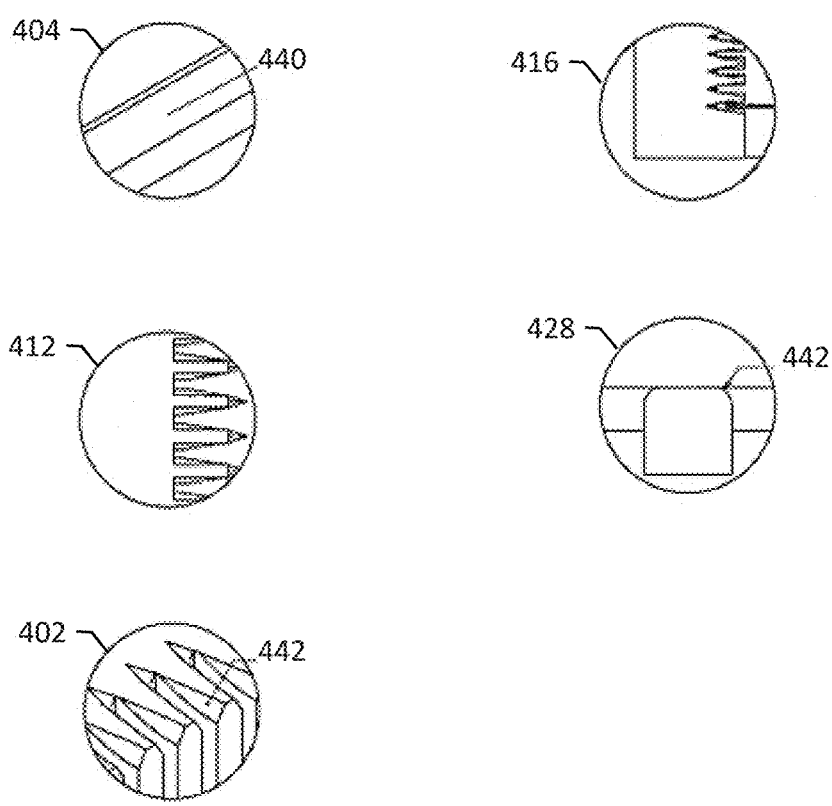

FIGS. 4A-E illustrate an example wafer carrier 400 having a number of notched side rods 408 that are parallel in a vertical direction. FIG. 4A is an isometric view of the wafer carrier 400, FIG. 4B is a top view of the wafer carrier 400, FIG. 4C is a front view of the wafer carrier 400, and FIG. 4D is a right side view of the wafer carrier 400. FIG. 4E shows detail views of portions of the wafer carrier 400.

Referring to FIGS. 4A-D, the wafer carrier 400 includes at least one handler lock 406 and typically handler locks on the front, back, left, and right sides of the wafer carrier 400. The handler lock 406 is shaped to engage a handler that an operator or robot can use to lift the wafer carrier 400. The wafer carrier 400 includes an overlapping opening 410, which can be useful, e.g., to guide semiconductor wafers into wafer slots during loading of the semiconductor wafers into the wafer carrier 400. For example, the overlapping opening 410 can be used as described above with reference to FIGS. 2F-H.

For example, an automated wafer-loading robot can load semiconductor wafers into the wafer carrier 400. The wafer carrier 400 also includes two side overlapping openings 410 (e.g., on each of the left and right sides) for guiding semiconductor wafers. FIGS. 4A-D illustrate two example semiconductor wafers 430 and 432.

In some examples, the wafer carrier 400 is sized to accommodate standard-conforming semiconductor wafers, e.g., standard sized silicon solar wafers. For example, the wafer carrier 400 can have a lateral width 418 between side rods of approximately 121-131 mm, a lateral width 414 between bottom rods of approximately 35-45 mm, a lateral width 426 between bottom feet of approximately 105-115 mm, an exterior lateral width 420 of approximately 146-156 mm, a vertical height 424 of approximately 76-86 mm, an interior horizontal depth 436 of approximately 144-154 mm, and an exterior horizontal depth 438 of approximately 240-250 mm. The example wafers can have a lateral width 422 of approximately 120-130 mm.

Referring to FIG. 4E, a first detail view 404 shows a portion of a bottom rod with a smooth surface 440 facing vertically upwards. A second detail view 416 shows a portion of an edge of the wafer carrier 400 illustrating that the wafer carrier 400 can be uniformly flat on its front and back sides to allow the wafer carrier 400 to sit in that orientation on a surface, which can be useful, e.g., to save space in storing the wafer carrier 400.

A third detail view 412 shows a portion of a notched side rod illustrating the notches, which can have a pitch of approximately 1.5-1.6 mm (e.g., a pitch from notch to notch, or a pitch from one side of a notch to the other side). A fourth detail view 428 shows a portion of a bottom rod illustrating a smooth surface plus a fillet, which can be useful, e.g., to prevent or reduce wafer edge chipping. A fifth detail view 402 shows a portion of a notched side rod illustrating a chamfer 442 for the notches, which can be useful, e.g., for guiding semiconductor wafers into wafer slots.

Figure 5A:
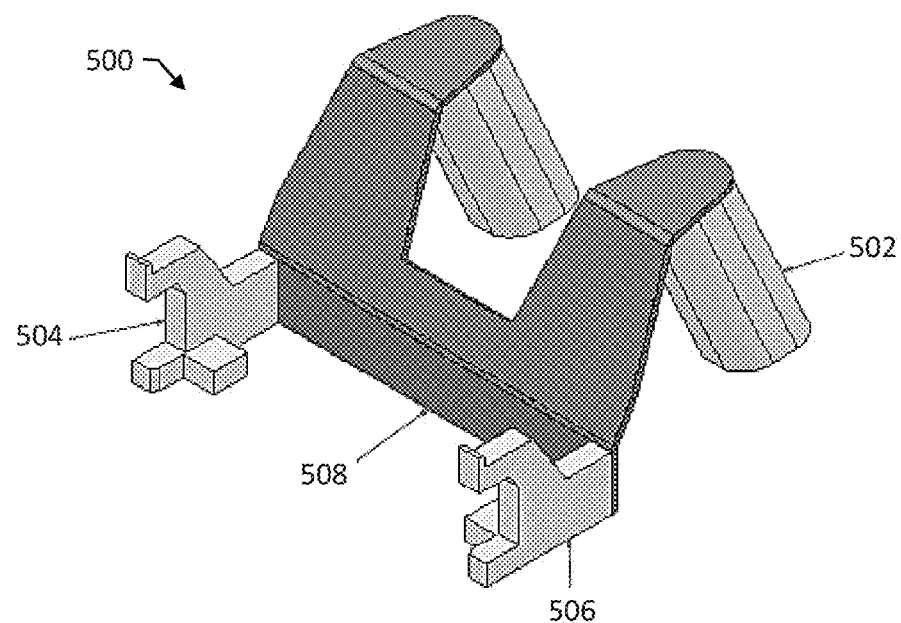
FIGS. 5A-B show examples of handlers that an operator or robot can use to lift a wafer carrier.
Figure 5B:
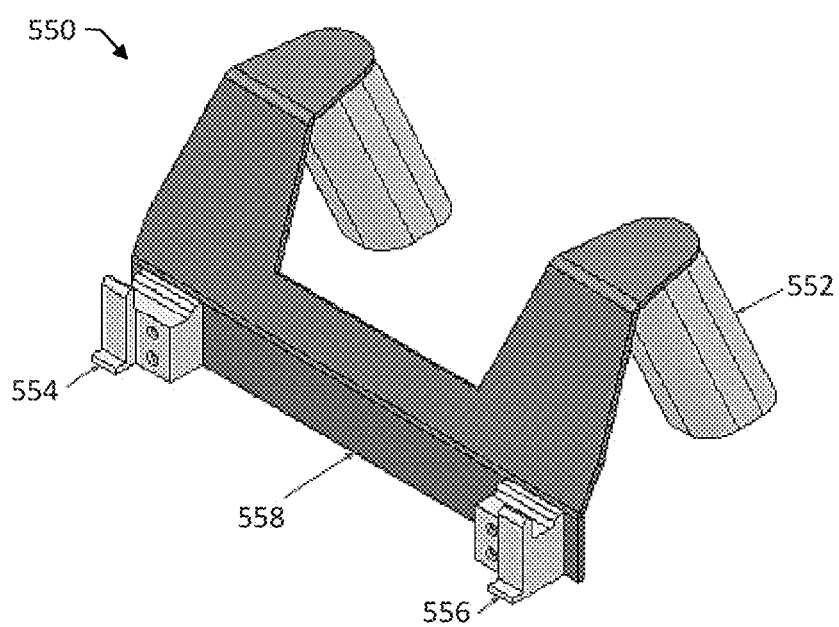

FIGS. 5A-B show examples of handlers that an operator or robot can use to lift a wafer carrier. FIG. 5A shows a first example handler 500. The handler 500 includes two back handles 502 for an operator or robot to grasp, two front handles 504 and 506 that mirror each other, and a linking plate 508 linking the back handles 502 to the front handles 504 and 506. The front handles 504 and 506 are shaped to engage front and back handler locks on a wafer carrier. The handler 500 can be used with, e.g., the wafer carrier 400 illustrated in FIGS. 4A-E, such that the front handles 504 and 506 engage front and back handler locks 406 and side rods 408 on one side of the wafer carrier 400.

FIG. 5B shows a second example handler 550. The handler 550 includes two back handles 552 for an operator or robot to grasp, two front handles 554 and 556 that mirror each other, and a linking plate 558 linking the back handles 552 to the front handles 554 and 556. The front handles 554 and 556 are shaped to engage front and back handler locks on a wafer carrier. The handler 550 can be used with, e.g., the wafer carrier 700 illustrated in FIGS. 7A-E, such that the front handles 554 and 556 engage front and back handler locks 704 and side rods 732 on one side of the wafer carrier 700.

Figure 6A:
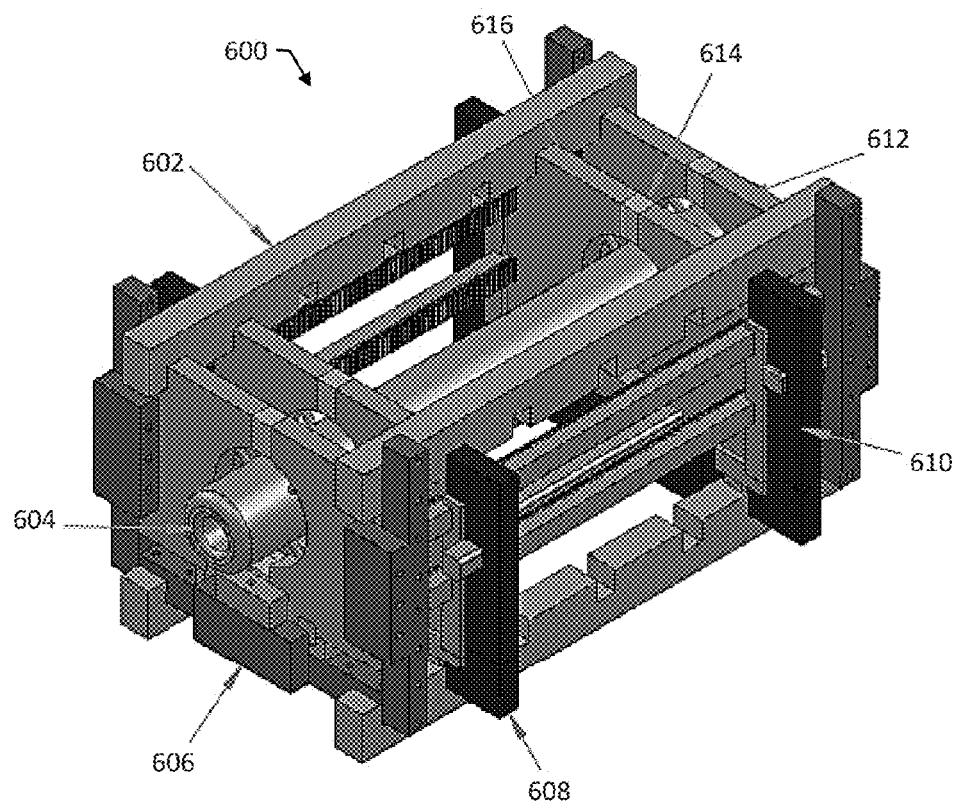
FIGS. 6A-C show an example holding apparatus for joining parallel side rods, bottom rods, and front and back plates of a wafer carrier.
Figure 6B:
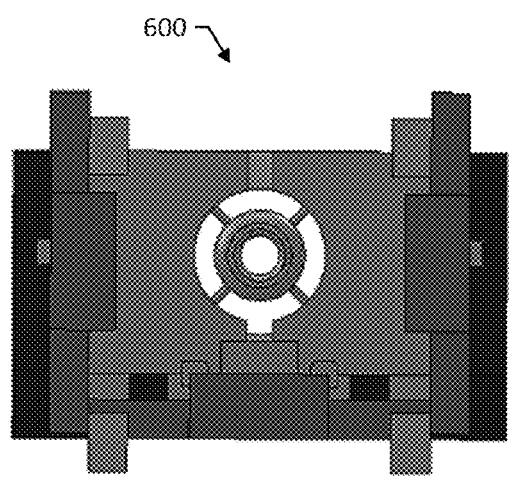
Figure 6C:
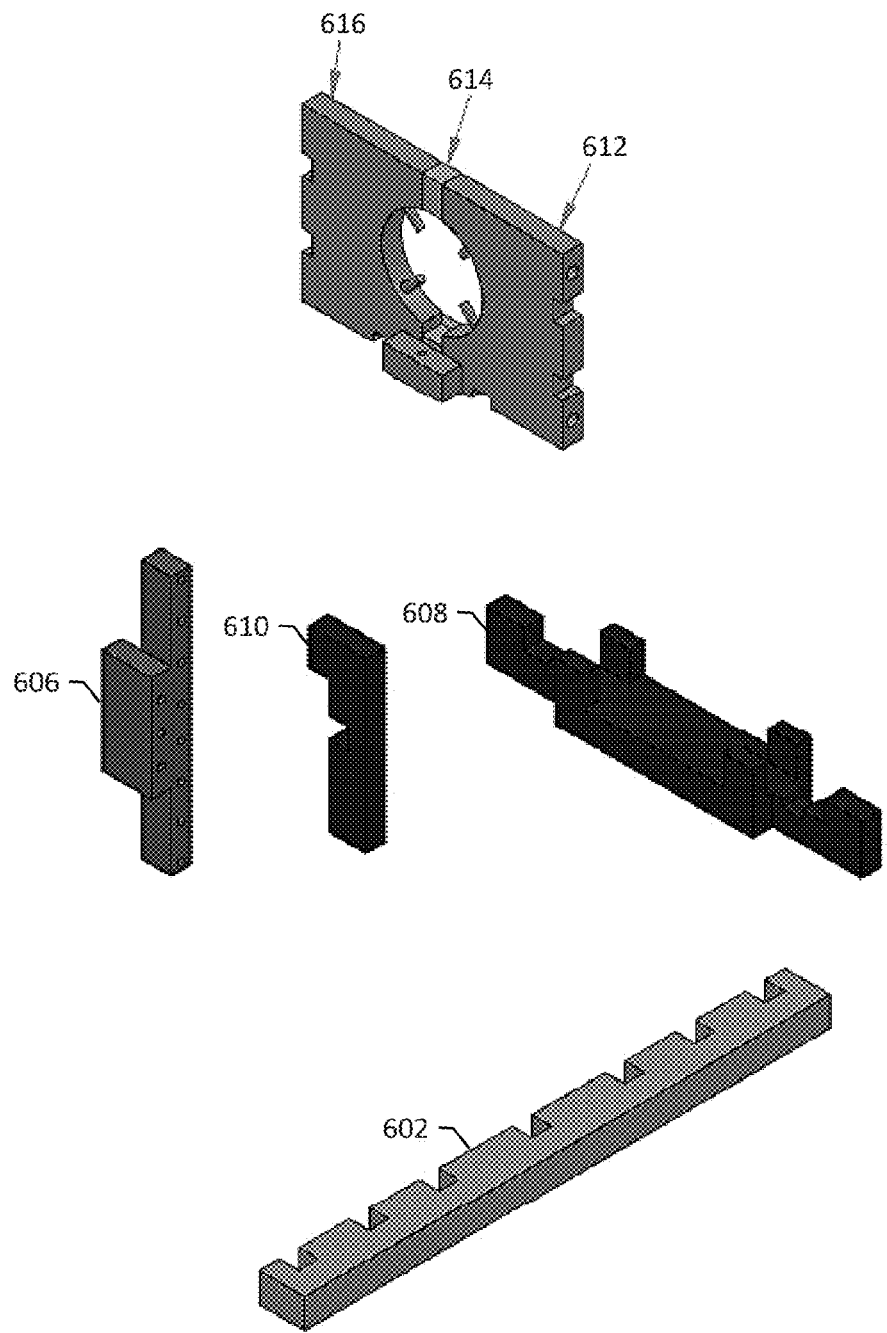

FIGS. 6A-C show an example holding apparatus 600 for joining parallel side rods, bottom rods, and front and back plates of a wafer carrier. FIG. 6A shows an isometric view of the holding apparatus 600, FIG. 6B shows a front view of the holding apparatus 600, and FIG. 6C shows an exploded view of the component holding parts of the holding apparatus 600.

Referring to FIG. 6A, the holding apparatus 600 includes horizontal holding members 602, a central tube 604, lateral holding members 606, lower and upper vertical holding members 608 and 610, and tube holding plates formed of a right side 612, a left side 616, and a filler 614. Referring to FIG. 6C, the holding apparatus 600 can be formed from six duplicates of a lateral holding member 606, two duplicates of a lower vertical holding member 608, four duplicates of an upper vertical holding member 610, and four duplicates of a horizontal holding member 602.

In operation, the holding members hold the rods and plates of a wafer carrier together while the rods and plates are joined, e.g., welded together. For example, the central tube 604 can be connected to a floor stand having two vertical arms, so that the holding apparatus 600 and the wafer carrier that it is holding can be rotated in place for convenient welding. Then, the holding apparatus 600 can be removed from the completed wafer carrier.

Figure 7A:
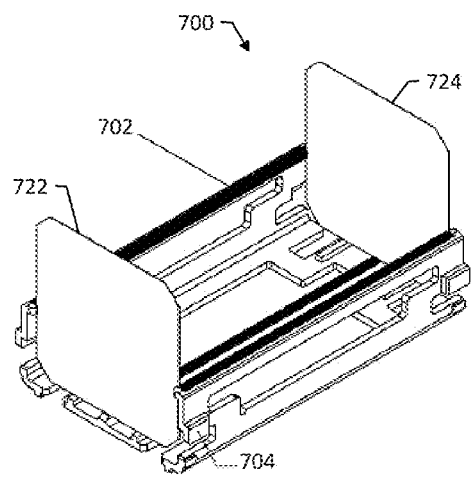
FIGS. 7A-E illustrate an example wafer carrier having a number of notched side rods that are parallel in a vertical direction.
Figure 7B:
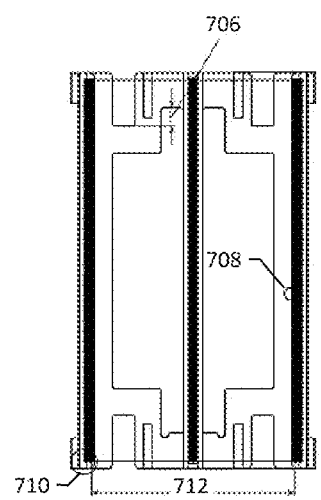
Figure 7C:
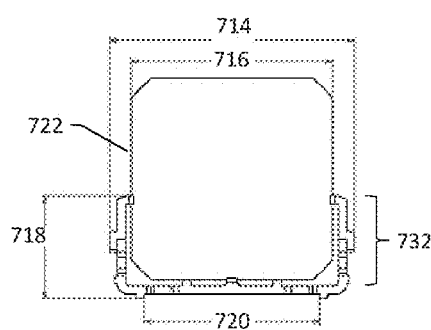
Figure 7D:
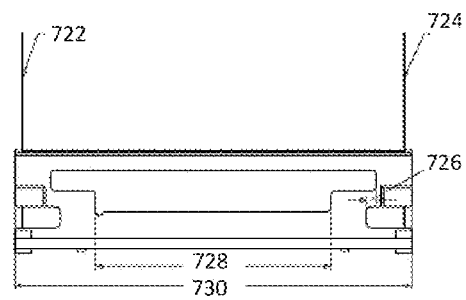
Figure 7E:
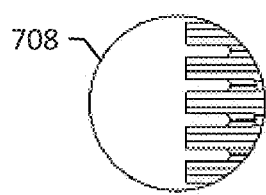
Figure 7E:
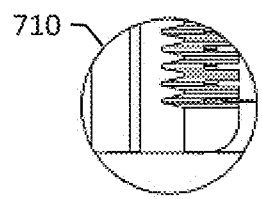
Figure 7E:
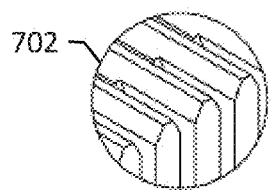

FIGS. 7A-E illustrate an example wafer carrier 700 having a number of notched side rods 732 that are parallel in a vertical direction. FIG. 7A is an isometric view of the wafer carrier 700, FIG. 7B is a top view of the wafer carrier 700, FIG. 7C is a front view of the wafer carrier 700, and FIG. 7D is a right side view of the wafer carrier 700. FIG. 7E shows detail views of portions of the wafer carrier 700.

Referring to FIGS. 7A-D, the wafer carrier 700 includes at least one handler lock 704 and typically handler locks on the front, back, left, and right sides of the wafer carrier 700. The handler lock 704 is shaped to engage a handler that an operator or robot can use to lift the wafer carrier 700. The wafer carrier 700 includes an overlapping opening 706, which can be useful, e.g., to guide semiconductor wafers into wafer slots during loading of the semiconductor wafers into the wafer carrier 700. For example, the overlapping opening 706 can be used as described above with reference to FIGS. 2F-H.

For example, an automated wafer-loading robot can load semiconductor wafers into the wafer carrier 700. The wafer carrier 700 also includes two side overlapping openings 726 (e.g., on each of the left and right sides) for guiding semiconductor wafers. FIGS. 7A-D illustrate two example semiconductor wafers 722 and 724.

In some examples, the wafer carrier 700 is sized to accommodate standard-conforming semiconductor wafers, e.g., standard sized silicon solar wafers. For example, the wafer carrier 700 can have a lateral width 712 between side rods of approximately 121-131 mm, a lateral width 720 between bottom feet of approximately 105-115 mm, an exterior lateral width 714 of approximately 146-156 mm, a vertical height 718 of approximately 59-69 mm, a horizontal depth 728 between overlapping apertures of approximately 140-150 mm, and a horizontal depth 730 outside the overlapping apertures of approximately 240-250 mm. The example wafers can have a lateral width 716 of approximately 120-130 mm.

Referring to FIG. 7E, a first detail view 708 shows a portion of a notched side rod illustrating the notches, which can have a pitch of approximately 1.5-1.6 mm (e.g., a pitch from notch to notch, or a pitch from one side of a notch to the other side). A second detail view 710 shows a portion of an edge of the wafer carrier 700 illustrating that the wafer carrier 700 can be uniformly flat on its front and back sides to allow the wafer carrier 700 to sit in that orientation on a surface, which can be useful, e.g., to save space in storing the wafer carrier 700. A third detail view 702 shows a portion of a notched side rod illustrating a chamfer for the notches, which can be useful, e.g., for guiding semiconductor wafers into wafer slots.

Figure 8:
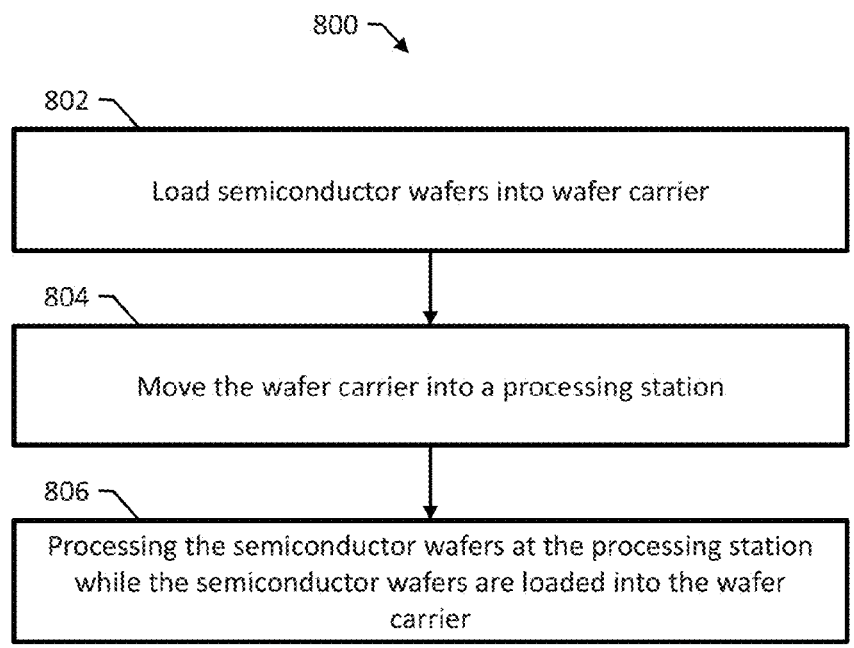
FIG. 8 is a flow diagram of an example method for processing semiconductor wafers.

FIG. 8 is a flow diagram of an example method 800 for processing semiconductor wafers. The method 800 can be performed by a human operator or by an appropriately programmed robot or automation machinery. The method 800 includes loading each semiconductor wafer of a number of semiconductor wafers into a respective semiconductor wafer slot of a semiconductor wafer carrier (802). The wafer carrier can be, e.g., one of the wafer carriers illustrated in FIG. 1A, 2A, 3A, 4A, or 7A. The method 800 includes moving the wafer carrier into a processing station (804), for example, using one of the handlers 500 and 550 illustrated in FIGS. 5A-B. The method 800 includes processing the semiconductor wafers at the processing station while the semiconductor wafers are loaded into the wafer carrier (806). The wafer carrier can then be removed from the processing station and, when appropriate, the semiconductor wafers can be unloaded from the wafer carrier.

Figure 9:
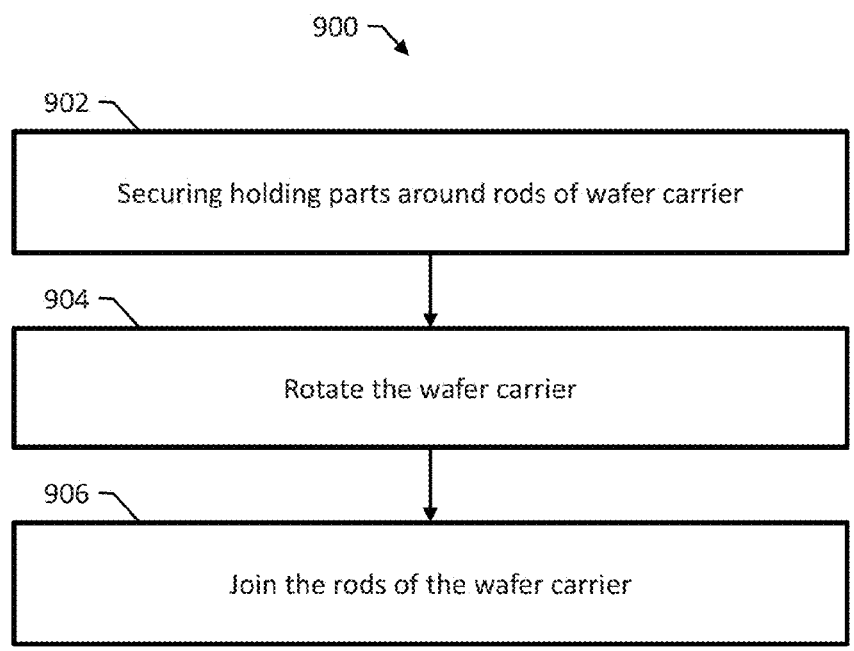
FIG. 9 is a flow diagram of an example method for manufacturing a semiconductor wafer carrier.

FIG. 9 is a flow diagram of an example method 900 for manufacturing a semiconductor wafer carrier. The method 900 can be performed by a human operator or by an appropriately programmed robot or automation machinery. The method 900 includes securing holding parts around parallel side rods, one or more bottom rods, and front and back plates of the wafer carrier (902). The holding parts can be, e.g., those illustrated for the holding apparatus 600 of FIG. 6A. The method 900 includes rotating the wafer carrier to access the joints between the rods and the plates (904) and joining the rods and the side plates (906), e.g., by welding. The holding parts can the be removed from around the completed wafer carrier.

Although specific examples and features have been described above, these examples and features are not intended to limit the scope of the present disclosure, even where only a single example is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed in this specification (either explicitly or implicitly), or any generalization of features disclosed, whether or not such features or generalizations mitigate any or all of the problems described in this specification. Accordingly, new claims may be formulated during prosecution of this application (or an application claiming priority to this application) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. A semiconductor wafer carrier comprising:
upper and lower left-side rods that are parallel in a vertical direction, wherein the upper and lower left-side rods each comprise a plurality of left-side notches, and wherein the left-side notches of the upper left-side rod are vertically aligned with the left-side notches of the lower left-side rod;
upper and lower right-side rods that are parallel in the vertical direction, wherein the upper and lower right-side rods each comprise a plurality of right-side notches, and wherein the right-side notches of the upper right-side rod are vertically aligned with the right-side notches of the lower right-side rod; and a plurality of bottom rods, wherein the upper and lower left-side rods, the upper and lower right-side rods, and the one or more bottom rods are joined so that the left-side notches face the right-side notches, defining a plurality of semiconductor wafer slots between the left-side notches, the right-side notches, and the bottom rods, and wherein the bottom rods are joined to define a plurality of apertures between the bottom rods, and wherein at least a first aperture overlaps a second aperture in a lateral direction between the upper and lower left-side rods and the upper and lower right-side rods;

wherein the bottom rods are joined by a plurality of horizontally-angled cross-members to define the plurality of apertures between the bottom rods.

2. The semiconductor wafer carrier of claim 1, wherein each of the bottom rods comprises a smooth surface facing vertically towards the plurality of semiconductor wafer slots.

3. The semiconductor wafer carrier of claim 1, comprising front and back plates each extending laterally between the upper and lower left-side rods and the upper and lower right-side rods, wherein the upper and lower left-side rods and the upper and lower right-side rods and the bottom rods extend horizontally from the front plate to the back plate.

4. The semiconductor wafer carrier of claim 3, wherein at least one of the front and back plates comprises an indentation extending laterally across an outside face of the at least one of the front and back plates, and wherein the indentation is shaped for gripping by an operator's fingers during handling.

5. The semiconductor wafer carrier of claim 1, comprising front and back handler locks each protruding away from the semiconductor wafer carrier and being shaped to lock and support a matching handler.

6. The semiconductor wafer carrier of claim 1, wherein the upper and lower left-side rods, the upper and lower right-side rods, and the bottom rods are formed of quartz or silicon carbide.

7. The semiconductor wafer carrier of claim 1, wherein each of the left-side notches and right-side notches comprises two opposing chamfer edges defining a width sized to receive a standard-conforming polycrystalline solar wafer.

8. The semiconductor wafer carrier of claim 1, wherein each of the plurality of semiconductor wafer slots has a height between the upper left-side and upper right-side rods and the bottom rods sized to receive a standard-conforming polycrystalline solar wafer, and wherein each of the plurality of semiconductor wafer slots has a lateral length between the upper and lower left-side rods and the upper and lower right-side rods sized to receive the standard-conforming polycrystalline solar wafer.

9. A method for processing semiconductor wafers, the method comprising:

loading each semiconductor wafer of a plurality of semiconductor wafers into a respective semiconductor wafer slot of a semiconductor wafer carrier, the semiconductor wafer carrier comprising:

upper and lower left-side rods that are parallel in a vertical direction, wherein the upper and lower left-side rods each comprise a plurality of left-side notches, and wherein the left-side notches of the upper left-side rod are vertically aligned with the left-side notches of the lower left-side rod;

upper and lower right-side rods that are parallel in the vertical direction, wherein the upper and lower right-side rods each comprise a plurality of right-side notches, and wherein the right-side notches of the upper right-side rod are vertically aligned with the right-side notches of the lower right-side rod; and a plurality of bottom rods, wherein the upper and lower left-side rods, the upper and lower right-side rods, and the one or more bottom rods are joined so that the left-side notches face the right-side notches, defining the semiconductor wafer slots between the left-side notches, the right-side notches, and the bottom rods, and wherein the bottom rods are joined to define a plurality of apertures between the bottom rods, and wherein at least a first aperture overlaps a second aperture in a lateral direction between the upper and lower left-side rods and the upper and lower right-side rods; and moving the semiconductor wafer carrier into a processing station and processing the semiconductor wafers at the processing station while the semiconductor wafers are loaded into the semiconductor wafer carrier;

wherein loading each semiconductor wafer into a respective semiconductor wafer slot comprises loading each semiconductor wafer using an automated tool that accesses the wafer carrier through a bottom side of the semiconductor wafer carrier through the plurality of apertures between the bottom rods.

10. The method of claim 9, wherein using the automated tool comprises extending a pusher of the automated tool through the first and second apertures.

11. The method of claim 10, wherein extending the pusher of the automated tool through the first and second apertures comprises extending first and second raised sections of the pusher through an overlap region of the bottom side of the semiconductor wafer carrier where the first aperture overlaps the second aperture.

12. The method of claim 11, wherein using the automated tool comprises loading a first semiconductor wafer into the overlap region to contact the pusher and then withdrawing the pusher from the semiconductor wafer carrier.

13. The method of claim 12, wherein withdrawing the pusher comprises withdrawing the pusher such that gravity pulls the first semiconductor wafer into a first semiconductor wafer slot in the overlap region.

14. The method of claim 9, wherein each of the bottom rods comprises a smooth surface facing vertically towards the plurality of semiconductor wafer slots, and wherein each of the left-side notches and right-side notches comprises two opposing chamfer edges, and wherein loading each semiconductor wafer into a respective semiconductor wafer slot comprises loading each semiconductor wafer to fit between the respective two opposing chamfer edges of the left-side notches and right-sides notches and to contact the smooth surface of the bottom rods.

15. The method of claim 9, wherein the semiconductor wafer carrier comprises front and back plates each extending laterally between the upper and lower left-side rods and the upper and lower right-side rods, and wherein each of the front and back plates comprises an indentation extending laterally across an outside face of the plate, and wherein moving the semiconductor wafer carrier comprises lifting the semiconductor wafer carrier using the indentations of the front and back plates.

16. The method of claim 9, wherein the semiconductor wafer carrier comprises front and back handler locks each protruding away from the semiconductor wafer carrier, and wherein moving the semiconductor wafer carrier comprises locking a handler onto the front and back handler locks and lifting the semiconductor wafer carrier by lifting the handler so that the front and back handler locks support the semiconductor wafer carrier.

17. The method of claim 9, wherein the upper and lower left-side rods, the upper and lower right-side rods, and the bottom rods are formed of quartz or silicon carbide, and wherein processing the semiconductor wafers comprises processing the semiconductor wafers using conditions that are corrosive to the semiconductor wafers and non-corrosive to the quartz or silicon carbide.

18. A method for manufacturing a semiconductor wafer carrier, the method comprising:

securing a plurality of holding parts around upper and lower left-side rods, upper and lower right-side rods, and a plurality of bottom rods so that:

the upper and lower left-side rods that are parallel in a vertical direction, wherein the upper and lower left-side rods each comprise a plurality of left-side notches, and wherein the left-side notches of the upper left-side rod are vertically aligned with the left-side notches of the lower left-side rod; and the upper and lower right-side rods that are parallel in the vertical direction, wherein the upper and lower right-side rods each comprise a plurality of right-side notches, and wherein the right-side notches of the upper right-side rod are vertically aligned with the right-side notches of the lower right-side rod; and joining the upper and lower left-side rods, the upper and lower right-side rods, and the bottom rods so that the left-side notches face the right-side notches, defining a plurality of semiconductor wafer slots between the left-side notches, the right-side notches, and the bottom rods, and so that the bottom rods define a plurality of apertures between the bottom rods, wherein at least a first aperture overlaps a second aperture in a lateral direction between the upper and lower left-side rods and the upper and lower right-side rods, and wherein the bottom rods are joined by a plurality of horizontally-angled cross-members to define the plurality of apertures between the bottom rods.

\* \* \* \* \*